United States Patent [19]
Coe et al.

[11] Patent Number: 4,521,795
[45] Date of Patent: Jun. 4, 1985

[54] INSULATED-GATE FIELD-EFFECT TRANSISTORS

[75] Inventors: David J. Coe, East Grinstead; Royce Lowis, Southampton, both of England

[73] Assignee: U.S. Philips Corporation, New York, N.Y.

[21] Appl. No.: 446,141

[22] Filed: Dec. 2, 1982

[30] Foreign Application Priority Data

Dec. 7, 1981 [GB] United Kingdom ............... 8136819

[51] Int. Cl.$^3$ ............................................. H01L 29/78
[52] U.S. Cl. .................................... 357/23.4; 357/15; 357/46
[58] Field of Search ............. 357/23 VD, 23 HV, 15, 357/46, 55

[56] References Cited

U.S. PATENT DOCUMENTS

| | | |
|---|---|---|
| 3,590,471 | 7/1971 | Lepselter ............................... 357/15 |
| 4,300,152 | 11/1981 | Lepselter ............................... 357/15 |
| 4,319,144 | 3/1982 | King et al. .................... 357/23 VD |

OTHER PUBLICATIONS

I.E.E.E. Transactions on Electron Devices; Coen et al.,; vol. ED-27; No. 2; Feb. 1980; pp. 340-343.
Electronics; LeBoss; Nov. 22, 1979; pp. 85-86.
Electronics; Krausse et al.; Aug. 28, 1980; pp. 145-147.
I.E.E.E. Transactions on Electron Devices; Plummer et al.; vol. ED-25; No. 11, Nov. 1978; pp. 1325-1327.

Primary Examiner—William D. Larkins
Assistant Examiner—Andrew J. Telesz, Jr.
Attorney, Agent, or Firm—Robert T. Mayer; Steven R. Biren

[57] ABSTRACT

An insulated-gate field-effect transistor which may be of the D-MOS or V-MOS type includes a source region (1) which is surrounded by a second region (2) of opposite conductivity type, itself surrounded by a third region (3) associated with the transistor drain (4). An insulated gate (12) of the transistor is present on a channel area of the second region (2) between the source region (1) and a first part (31) of the third region (3). The third region (3) also has a surface-adjoining second part (32) which is remote from the first part (31) and preferably has a lower doping concentration than the second and source regions (2, 1). An electrode layer (11) which may be the source electrode extends on said second part (32) of the third region (3) and is connected to said second region (2), and there is present between this electrode layer (11) and the second part (32) of the third region (3) a Schottky junction (33) having a lower forward voltage drop than the p-n junction (34) between the second and third regions (2,3). The transistor can have a fast switching speed even when driving inductive loads, since the Schottky junction (33) suppresses minority carrier injection at the forward-biased p-n junction (34) during voltage overswings. Preferably the second part (32) of the third region (3) is laterally bounded by the second region (2) which forms a guard ring for the Schottky junction (33) so maintaining a high blocking voltage capability. In order to further suppress minority carrier injection the electrode layer (11) preferably forms with the second region (2) a Schottky junction around which the source region (1) preferably extends as a guard ring.

11 Claims, 6 Drawing Figures

INSULATED-GATE FIELD-EFFECT TRANSISTORS

BACKGROUND OF THE INVENTION

This invention relates to insulated-gate field-effect transistors, particularly but not exclusively so-called power "D-MOS" and "V-MOS" transistors suitable for high power and fast switching applications.

Insulated-gate field-effect transistors are known comprising a semiconductor body having a surface-adjoining source region of one conductivity type which is surrounded in the body by a surface-adjoining second region of the opposite conductivity type, the second region being surrounded in the body by a surface-adjoining third region which is of said one conductivity type and is associated with the drain of the transistor. An insulating layer is present on a part of the second region, and a conductive layer is present on said insulating layer to form an insulated gate of the transistor for capacitively controlling in said part of the second region a conductive channel between the source region and a first part of the third region. Different specific types of this known transistor structure are described in, for example, I.E.E.E. Transactions on Electron Devices, Vol. ED-25, No. 11 (November 1978), pages 1325 to 1327, and Vol. ED-27, No. 2, (February 1980), pages 340 to 343, and Electronics, Nov. 22, 1979, pages 85 and 86 and Aug. 28, 1980, pages 145 to 147.

The article in I.E.E.E. Transactions ED-25 describes a high voltage double-diffused lateral D-MOS transistor in which the source and second regions are diffused into the third region and in which a drain region is also present and contacted at the same major surface of the body as the source and second regions. This particular D-MOS transistor is also suitable for incorporation in a monolithic integrated circuit. The article in I.E.E.E. Transaction ED-27 describes a high power double-diffused vertical D-MOS transistor in which the source and second regions are diffused into the third region (an epitaxial layer) and in which a drain region is provided by the substrate and contacted at the opposite major surface of the body from the source and second regions. The 1979 article in Electronics describes power V-MOS transistors which have a vertical source-drain configuration and a groove extending through the double-diffused source and second regions, the insulated gate being present on the walls of the groove. The 1980 article in Electronics describes a high power vertical transistor of the D-MOS type in which the source and second regions are formed by a double implantation instead of double diffusion. Non-power low voltage types of said known transistor structure are also fabricated in integrated circuits, especially in a lateral D-MOS configuration. In this case, the bulk of the semiconductor body may form the third region of a plurality of such transistors.

These insulated-gate field-effect transistors can have a high switching speed. This high speed is assisted by the fact that they are unipolar majority carrier devices. Thus minority charge carriers are not involved in current transport through the transistor so that the turn-off rate of the transistor is not reduced by minority carrier storage effects such as occur in the base regions of bipolar transistors. However the Applicants have found that, particularly when used to drive inductive loads, the turn-off of such an insulated-gate field-effect transistor is slower than expected. The Applicants believe that this reduction in speed results from the p-n junction between the second and third regions being temporarily forward-biased by the overswing voltage from the inductive load as a result of which minority charge carriers can be injected into the third region from the second region and cause minority carrier storage effects. Furthermore the Applicants consider that using a forward-biased junction of such a transistor to clamp the voltage overswing can be desirable to avoid exceeding the breakdown voltage of the transistor and to recover the inductive energy and return it to the power supply.

SUMMARY OF THE INVENTION

According to the present invention there is provided an insulated-gate field-effect transistor comprising a semiconductor body having a surface-adjoining source region of one conductivity type which is surrounded in the body by a surface-adjoining section region of the opposite conductivity type, the second region being surrounded in the body by a surface-adjoining third region which is of said one conductivity type and is associated with the transistor drain, an insulating layer being present on a part of the second region, and a conductive layer being present on said insulating layer to form an insulated gate of the transistor for capacitively controlling in said part of the second region a conductive channel between the source region and a first part of the third region, characterized in that the third region has a surface-adjoining second part which is remote from the first part, in that an electrode layer extends on said second part of the third region and is connected to said second region, and in that there is present between said electrode layer and the second part of the third region a Schottky junction having a lower forward voltage drop than the p-n junction between the second and third regions.

Thus, field-effect transistors in accordance with the invention have a Schottky junction which is connected in parallel with the p-n junction between the second and third regions and which has a lower forward voltage drop than this p-n junction. In the event of a voltage overswing which forward biases the p-n junction between the second and third regions, the Schottky junction also becomes forward-biased and diverts current away from the p-n junction because of its lower forward voltage drop. The exact ratio between the majority carrier current through the Schottky junction and the minority carrier current through the p-n junction can be controlled by adjusting relative contact areas and the Schottky barrier height so that very little minority carrier injection occurs. Transistors in accordance with the invention can be designed for high power and fast switching applications, and may be of the so-called D-MOS or V-MOS type. However, transistors in accordance with the invention may also be designed for low voltage applications and may be formed in large numbers in an integrated circuit.

Surprisingly the Schottky junction can be incorporated in the transistor in a very simple, reliable and elegant manner without necessarily complicating the manufacture of the transistor. In some cases, the manufacture of the transistor can even be simplified. Thus, the same window in a single mask may be used to form both the source and second regions (for example by implantation or/and diffusion), and the extent and doping concentration profile of the second region between the source region and the second part of the third region can be substantially the same as those between the source region and the first part of the third region, i.e. where the transistor channel is formed. In this case, extra manufacturing steps for providing an additional highly-doped diffused contact region for the second region (such as is included in the known transistors illustrated in the I.E.E.E. Transactions ED-25 article and the 1980 Electronics article) are not required. However, if desired for very low ohmic contact to the second region, an additional highly-doped contact region (forming part of the second region) may be provided in a transistor in accordance with the present invention and may have an annular configuration extending around the second part of the third region. The second part of the third region preferably has a lower conductivity type determining doping concentration than that of the second region and source region so as to simplify the formation of the Schottky junction with this second part of the third region.

The electrode layer associated with the Schottky junction may also extend onto the second region to form the electrical connection to the second region, thus simplifying the transistor structure, especially if the Schottky junction itself is also formed by the electrode layer rather than by an extra interface layer provided below the electrode layer. The ratio of the majority and minority carrier currents at the Schottky and p-n junctions respectively can be determined by the relative areas of the interface of the electrode layer with the second part of the third region and with the second region and by choice of an appropriate Schottky barrier height. This ratio can be optimized in a simple manner when the extent of the second region at this location corresponds to that where the transistor channel is formed, both having been determined in a self-registered manner with respect to the source region by the use of the same mask window for the definition of the source and second regions.

In a particularly simple form, a source electrode which contacts the source region may also extend laterally over the second region and the second part of the third region to form an electrical connection between the second and source regions and to form said electrode layer (and even the Schottky junction itself) on the second part of the third region. By appropriately choosing the material of the source electrode and the doping concentrations of the relevant regions, this source electrode can form an effectively ohmic contact with the source region and a Schottky junction with the second part of the third region. When the third and source regions are of n-type silicon, the source electrode may be of aluminum for this purpose. When the source electrode also forms the Schottky junction (or at least its electrode layer), the Schottky junction is connected in parallel between the source and drain of the transistor. In this case if the transistor is to be operated with high voltages (for example 100 volts to 1000 volts), it is also necessary to design the Schottky junction to maintain a high blocking voltage capability.

A high blocking voltage capability for the Schottky junction can be obtained readily in accordance with the invention when the second region of opposite conductivity type extends around the periphery of the Schottky junction to laterally bound the second part of the third region and to form effectively a peripheral guard ring for the Schottky junction. In a high current device having an annular source region and an annular insulated gate (both of which may have a meandering or interdigitated or polygonal configuration), this guard ring effect can be achieved simply by the third region extending to the electrode layer at the surface through the middle of the second region surrounded by the annular source region. Thus, in forming a high current device the source region in the second region may also extend around the second part of the third region. The barrier height and interface area of the Schottky junction can readily be chosen to provide an acceptably low leakage current across the Schottky junction when blocking high voltage levels. If the electrode layer itself does not provide a sufficiently high barrier height for this purpose an intermediate or interface layer can be provided at the surface of the second part of the third region below the electrode layer so as to form the Schottky junction.

Although in the description and claims of the present specification reference is made to guard rings and annular regions, these rings and annular regions need not have a circular geometry, but may be for example square, rectangular or any other desired closed configuration, even of irregular shape.

BRIEF DESCRIPTION OF THE DRAWING

These and other features in accordance with the present invention will now be described with reference to the accompanying diagrammatic drawings to illustrate, by way of example, various embodiments of the invention. In these drawings.

Figure 1:
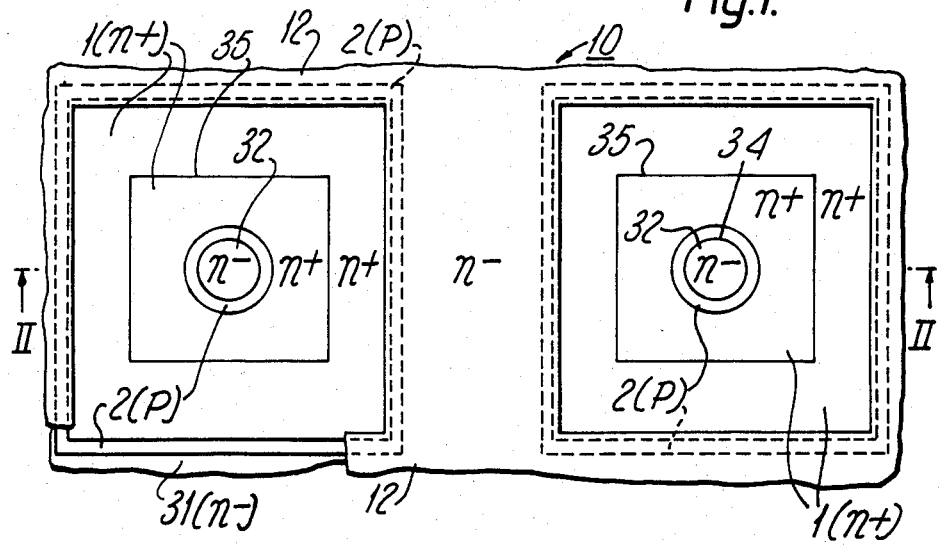
FIG. 1 is a partly cut-away plan view of part of a semiconductor body of an insulated-gate field-effect transistor in accordance with the invention.

It should be noted that all the Figures are diagrammatic and not drawn to scale. In particular the relative dimensions and proportions of some parts of FIGS. 1, 2, 3, 5 and 6 have been shown greatly exaggerated or reduced for the sake of convenience and clarity in the drawing. Also for the sake of clarity the various semiconductor regions of the body and the insulating layers are not hatched in the cross-sections of FIGS. 1, 2, 3, 5 and 6. The same reference numerals as used in one embodiment are generally used to refer to corresponding or similar parts in the other embodiments.

DESCRIPTION OF THE PREFERRED EMBODIMENTS

Figure 2:
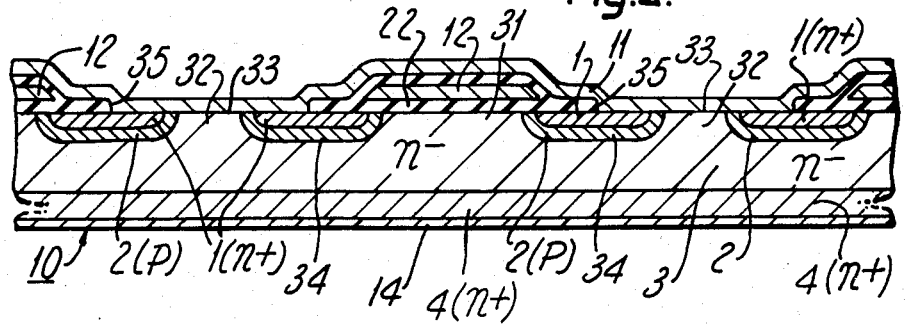
FIG. 2 is a cross-sectional view of the transistor on the line II—II of FIG. 1.

The insulated-gate field-effect transistor of FIGS. 1 and 2 is of a vertical D-MOS type and comprises a monocrystalline silicon semiconductor body 10 having an n-type surface-adjoining source region 1 surrounded in the body 10 by a p-type surface-adjoining second region 2. The p-type region 2 is surrounded in the body 10 by an n-type surface-adjoining third region 3 which is associated with the transistor drain. A highly-doped n-type drain region 4 adjoins the opposite major surface of the body 10 from the regions 1, 2 and 3. The drain region 4 is provided by a low-resistivity substrate which has metallization 14 on its back surface forming a drain electrode. A low-doped high resistivity n-type epitaxial layer is present on the substrate 4 to provide the third region 3 which constitutes a drain drift zone. The regions 1 and 2 are formed by locally overdoping this epitaxial layer. An insulating layer 22 is present on a part of the p-type region 2, and a conductive gate layer 12 is present on the insulating layer 22 to form an insulated gate of the transistor for capacitively controlling in said part of the p-type region 2 a conductive channel between the source region 1 and a first part 31 of the region 3. The layer 22 may be of silicon dioxide or any other suitable dielectric. In spite of the designation "D-MOS", the gate layer 12 need not be of metal, and it may be for example doped polycrystalline silicon or a metal silicide.

In accordance with the present invention, the region 3 has a surface-adjoining second part 32 which is remote from the first part 31. An electrode layer 11 extends on this second part 32 of the region 3 and is connected to the p-type region 2. There is present between the electrode layer 11 and the second part 32 of the region 3 a Schottky junction 33 having a lower forward voltage drop than the p-n junction 34 between the regions 2 and 3. In the particular example illustrated in FIG. 1 this electrode layer 11 is the metallization providing the source electrode, and the part 32 of region 3 has a lower conductivity type determining doping concentration than the regions 1 and 2. This source electrode 11 forms an effectively ohmic contact with the highly doped source region 1 and can itself form the Schottky junction 33 with the low-doped second part 32 of the region 3. Thus, for example, when the surface doping concentrations of the regions 1 and 2 and part 32 are respectively about $10^{21}$ cm$^{-3}$, $10^{17}$ cm$^{-3}$ and $10^{14}$ cm$^{-3}$, the source electrode 11 may be of aluminum to form a Schottky barrier height of about 0.7 eV with the part 32 of the region 3. Other metals which may be used for the electrode layer 11 are, for example gold-coated or silver-coated molybdenum or chromium.

Depending on the precise surface doping concentration of the region 2 and the material of the electrode layer 11 (at least at the interface with the region 2), the layer 11 can form with the p-type region 2 either an ohmic contact (for example with a surface doping concentration greater than about $2 \times 10^{17}$) or a Schottky junction of low barrier height with a lower surface doping concentration of region 2. The latter case is particularly useful in further restricting minority carrier injection as described in more detail hereinafter.

The particular transistor structure illustrated in FIGS. 1 and 2 is for high power applications. In order to switch a large current, a large number of transistor cells are present in the body 10, each cell comprising an individual annular source region 1 in an annular p-type region 2. FIGS. 1 and 2 show only two of these cells. There is a single gate layer 12 of a grid configuration which extends around the outside of the individual source regions 1 so as to overlie the part of region 2 in which the transistor channel is induced. Part of the gate layer 12 is cut-away in the plan view of FIG. 1. In FIG. 1 the outline of the regions 1 and 2 is illustrated with a broken line beneath the gate layer 12. As shown in FIGS. 1 and 2 the gate layer 12 in this particular embodiment also overlies the part 31 of the region 3. The edge of the contact window for the source electrode 11 is indicated with reference numeral 35. In the particular embodiment of FIGS. 1 and 2, the source electrode 11 also extends above the gate electrode 12 from which it is separated by a further insulating layer. Thus, the transistor of FIGS. 1 and 2 is similar to that disclosed in the article on pages 145 to 147 of Electronics, Aug. 28, 1980, except that the regions 1 and 2 are annular so that the secoond part 31 of the region 3 extends through the p-type region 2 to form the Schottky junction 33 with the electrode layer 11 at the upper major surface of the body 10.

In spite of the provision of the Schottky junction 33 between the source and drain, the transistor retains a high blocking voltage capability because the annular p-type region 2 laterally bounds the part 32 of the region 3 to form a guard ring around the whole periphery of the Schottky junction 33 so as to prevent premature breakdown of the junction 33 at its periphery. The provision of an annular source region 1 extending in the region 2 around the part 32 of the region 3 is important not only for obtaining a high current capability, but also for reducing current flow into the p-type region 2 from the electrode layer 11 by reducing the contact area between the region 2 and electrode layer 11. When electrode layer 11 forms a Schottky junction with the p-type region 2, the n-type source region also acts as a guard ring around this Schottky junction. As a result the annular source region 1 in the annular p-type region 2 maintains the fast recovery time of the diode formed by the Schottky junction 33 even at high current levels. Having an annular configuration for both the source and p-type regions 1 and 2 can also simplify the manufacture of the transistor.

Figure 3:
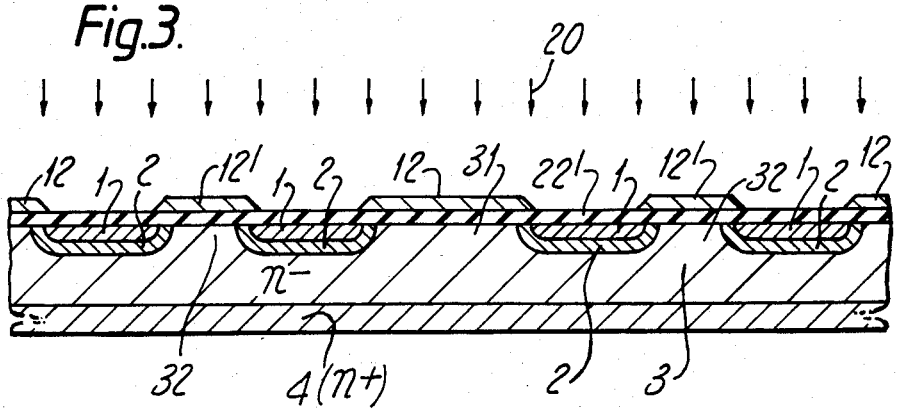
FIG. 3 is a cross-sectional view of the semiconductor body part of FIG. 2 at a stage in the manufacture of the transistor.

The transistor of FIGS. 1 and 2 can be manufactured using known technologies, for example as used to manufacture the field-effect transistor disclosed in Electronics, Aug. 28, 1980, pages 145 to 147. Thus, the gate layer 12 may be formed with a tapering edge as described in said Electronics article and may be used as an implantation mask for forming the source region 1 and p-type region 2 by a double implantation. This stage in the manufacture is illustrated in FIG. 3, in which layer 22' represents an overall insulating layer a part of which provides the final gate dielectric 22 and in which the arrows 20 represent either acceptor or donor dopant ions implanted to form the p-type region 2 or source region 1 respectively.

In the case of the known field-effect transistor described in said Electronics article the implantation mask formed as a polycrystalline silicon layer pattern consists solely of the gate grid 12. However, in the manufacture of the transistor of FIGS. 1 and 2, the central part 32 of the region 3 within each aperture of the gate grid 12 is also masked against the implantation so forming the annular configuration for regions 1 and 2. The parts 32 may be masked by islands 12' of photoresist or of polycrystalline silicon. In the latter case, the islands 12' can be part of the polycrystalline silicon layer pattern which includes the gate grid 12 so that the islands 12' may have similarly tapering edges. This results in the extent and doping concentration profile of the p-type region 2 between the source region 1 and the masked part 32 of region 3 being determined in a reliable and reproduceable manner and actually being substantially the same as that in the transistor channel area between the source region 1 and the part 31 of the region 3. Such careful control of the surface doping concentration and extent of the p-type region 2 is particularly important when forming a Schottky junction between the layer 11 and the region 2. Polycrystalline silicon mask islands 12' are subsequently removed by etching while masking the gate grid 12. Because of the large space between the parts 12' and 12 a wide overlapping photoresist pattern can be used to mask the grid 12 during this etching step so that the provision of this wide photoresist pattern does not require a critical low-tolerance alignment step. Thus the manufacture of the transistor of FIGS. 1 and 2 incorporating the Schottky junction 33 can be a surprisingly simple adaptation of known vertical D-MOS manufacturing processes.

Figure 4:
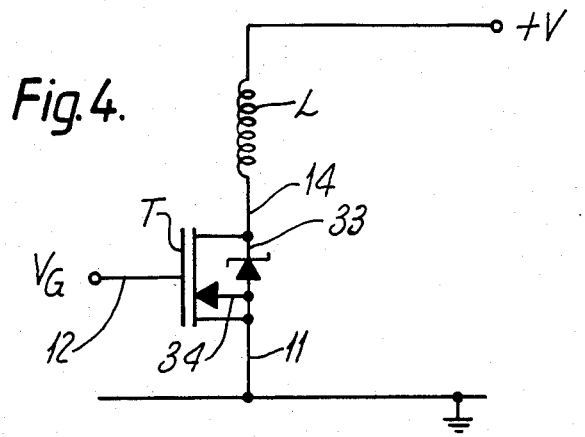
FIG. 4 is a circuit diagram including such a transistor in accordance with the invention.

FIG. 4 illustrates the use of a power switching transistor T in accordance with the invention (such as the transistor of FIGS. 1 and 2) to drive an inductive load L. With a positive gate voltage $V_G$ higher than the transistor threshold voltage, the transistor T is on and current flows from a power supply V through the inductive load L. This inductive load L may be for example a coil of a transformer or an electric motor. When the transistor T is switched off by the application of zero or a negative gate voltage the inductive load generates a voltage overswing which temporarily forward biases both the p-n junction 34 between regions 2 and 3 and the Schottky junctions 33 between the source electrode layer 11 and the region 3. The junction 34 is represented in FIG. 4 by a p-n diode symbol integrated with the transistor symbol, and the junction 33 is represented by a Schottky diode symbol similarly integrated.

In the absence of the Schottky junction 33, significant minority carrier injection occurs at the forward-biased p-n junction 34 which results in minority carrier storage effects slowing the turn-off rate of the transistor. However, in accordance with the present invention, the Schottky junction 33 having a lower forward voltage drop than the p-n junction 34 is connected in parallel with the p-n junction 34 by the electrode layer 11. The forward voltage drop of a junction corresponds to the forward bias voltage across the junction at which significant conduction starts to occur. In the absence of the Schottky junction 33 the forward voltage drop of the p-n junction 34 in silicon is about 0.7 volts. In the case of an aluminum layer 11 and with the doping concentrations given above, by way of example, the forward voltage drop of the Schottky junction formed between the electrode layer 11 and the part 32 of region 3 is about 0.3 volts. When the voltage overswing from the inductive load L reaches this lower voltage level the Schottky junction 33 begins to conduct by injecting electrons (i.e. majority charge carriers) into the n-type region 3. Thus the Schottky junction 33 suppresses minority charge carrier injection at the p-n junction 34 by diverting current away from the junction 34 having the higher forward voltage drop.

For a given Schottky barrier height, the exact ratio between the majority current through the Schottky junction 33 and the minority current through the p-n junction 34 can be controlled by adjusting the relative areas in contact with the electrode layer 11. This ratio of currents can be maximized while still maintaining a simple and reliably-reproduceable manufacturing process when the lateral extent and doping profile of region 2 at this location has been determined in a self-registered manner (for example by the previously-described double implantation through the mask 12, 12') with respect to the source region 1. Instead of the double implantation process a double diffusion process may be used to effect the self-registration, in which case the parts of the insulating layer 22' exposed at the annular apertures in the mask pattern 12, 12' may be removed to form diffusion windows.

In order to further suppress minority carrier injection in the region 2, it is advantageous to have a rectifying Schottky barrier between the electrode layer 11 and the p-type region 2. Minority carrier injection by the forward-biased p-n junction 34 is then further restricted by current saturation in this reverse-biased p-type Schottky junction, while capacitive charging currents flowing during reverse-biasing of the p-n junction 34 can still be extracted via this p-type Schottky junction being forward-biased. Extraction of this charging current prevents dV/dt breakdown of the parasitic n-p-n transistor structure 1, 2, 3.

Furthermore, the forward conduction through the n-type Schottky junction 33 during an inductive overswing is advantageous in clamping the voltage overswing to avoid exceeding the breakdown voltage of the transistor T and also to recover the inductive energy and return it to the power supply V.

Many modifications are possible within the scope of the present invention. Thus, for example, if the Schottky junction which the electrode layer 11 would naturally form with the part 32 of region 3 does not have an optimum barrier height, the effective barrier height can be increased or decreased to a more advantageous value by incorporating a fully-depleted shallow doped layer at the surface of part 32 and entirely within the zero-bias thickness of the depletion layer of the Schottky junction. Such an adjustment of Schottky barrier heights is described generally in published U.K. patent specification No. (GB) 1459231. Furthermore, if the electrode layer 11 itself does not form a suitable Schottky barrier with the part 32, an interface layer (for example of a completely different metal silicide such as platinum silicide) may be incorporated between the layer 11 and the part 32. By incorporating such an interface layer only locally below the layer 11, the relative barrier heights of Schottky junctions between the layer 11 and the regions 3 and 2 can be determined in a flexible manner.

In the transistor of FIGS. 1 and 2, the insulated gate 12 is present on the upper major surface of the body 10 over a channel part of the region 2 and over the surface-adjoining part 31 of the region 3. However, the transistor may also have a structure as disclosed in U.S. Pat. No. 4,466,175 in which the gate 12 is in the form of strips present only over the channel part of each region 2 and in which the surface doping concentration of part 31 of the region 3 may be increased considerably, for example in the doping step for forming the source region 1. However, in this case, the part 32 of region 3 is masked against this increase in surface doping concentration so as to form a good quality Schottky junction 33.

Figure 5:
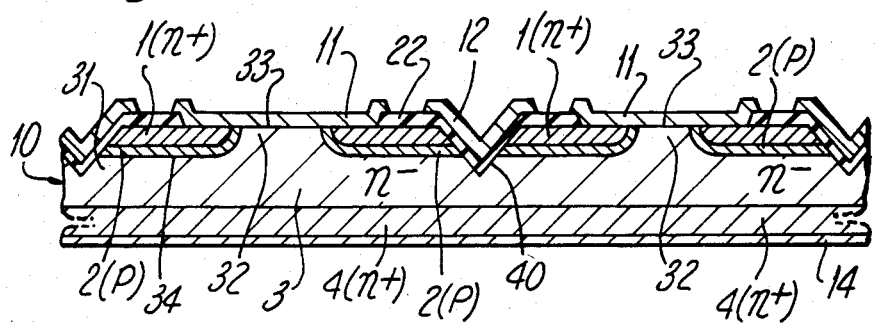
FIG. 5 is a cross-sectional view of part of a semiconductor body of another insulated-gate field-effect transistor in accordance with the invention.

FIG. 5 illustrates a further modification in which the insulated gate 12 is present on a part of the p-type region 2 at a groove 40 in the upper major surface of the body 10. Thus, apart from the incorporation of the Schottky junction 33 in accordance with the invention, such a transistor is similar in structure to the V-MOS transistors described in Electronics, Nov. 22, 1979, pages 85 and 86. The groove 40 may be flat-bottomed, if so desired. Furthermore, if desired the Schottky junction 33 may also be formed at a groove in the upper major surface of the body 10.

Figure 6:
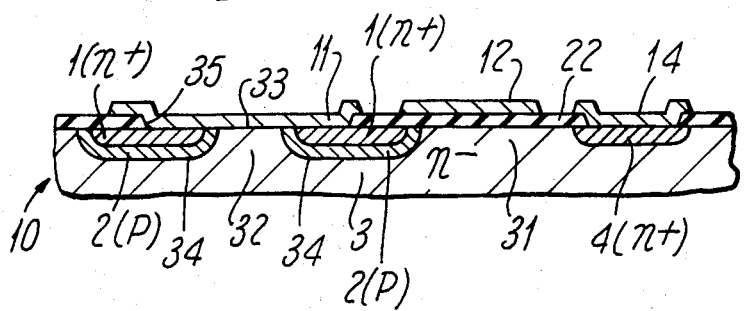
FIG. 6 is a cross-sectional view of part of a semiconductor body of a further insulated-gate field-effect transistor in accordance with the inventiion.

FIG. 6 illustrates a further modification having a so-called lateral D-MOST structure in which the drain region 4 is now also present at the same upper major surface of the body 10 as the source region 1. Since the transistor of FIG. 6 retains the annular regions 1 and 2 around the Schottky junction, it can have a high breakdown voltage, and can be either a discrete transistor formed in an n-type body 10 or a transistor element of an integrated circuit. In the case of an integrated circuit the transistor element of FIG. 6 may be formed in an n-type epitaxial layer on a p-type substrate as described in for example I.E.E.E. Transactions on Electron Devices, ED-25, No. 11, pages 1325 to 1327 (but without a p+ contact diffusion) or it may be formed as one of many such transistor elements in an n-type semiconductor body. In the case of a low-signal transistor element both the source region 1 and p-type region 2 need only be present as a simple (non-annular) region between the electrode layer 11 and the gate layer 12, so that the cross-section of FIG. 6 only the right-hand section of the regions 1 and 2 would be present whereas at the left-hand side of the contact window 35 the regions 1 and 2 would be absent and the Schottky junction 33 would extend to the edge of the window 35. A plurality of such low-signal transistor element structures each with a Schottky junction 33 may be incorporated in an integrated circuit.

What is claimed is:

1. An insulated-gate field-effect transistor comprising a semiconductor body having a surface-adjoining source region of one conductivity type which is surrounded in the body by a surface-adjoining second region of the opposite conductivity type, the second region being surrounded in the body by a surface-adjoining third region which is of said one conductivity type and is associated with the transistor drain, an insulating layer on a part of the second region, and a conductive layer on said insulating layer to form an insulated gate of the transistor for capacitively controlling in said part of the second region a conductive channel between the source region and a first part of the third region, characterized in that the third region has a surface-adjoining second part which is remote from the first part, in that an electrode layer extends on said second part of the third region and is connected to said second region, and in that there is provided between said electrode layer and the second part of the third region a Schottky junction having a lower forward voltage drop that the p-n junction between the second and third regions.

2. A transistor as claimed in claim 1, further characterized in that the second part of the third region has a lower conductivity type determining doping concentration than the second and source regions.

3. A transistor as claimed in claim 1 or claim 2, further characterized in that the second part of the third region is laterally bounded by the second region of opposite conductivity type which extends around the periphery of the Schottky junction to form a guard ring for the Schottky junction.

4. A transistor as claimed in claim 3, further characterized in that the source region in the second region also extends around the second part of the third region.

5. A transistor as claimed in claim 1, further characterized in that the extent and doping concentration profile of the second region between the source region and the second part of the third region are substantially the same as between the source region and the first part of the third region.

6. A transistor as claimed in claim 1, further characterized in that a source electrode which contacts the source region also extends laterally over the second region and the second part of the third region to form an electrical connection between the second and source regions and to form said electrode layer on the second part of the third region.

7. A transistor as claimed in claim 1, further characterized in that the electrode layer forms a Schottky junction with the second region.

8. A transistor as claimed in claim 1, further characterized in that the Schottky junction with the second part of the third region is formed by the said electrode layer.

9. A transistor as claimed in claim 6, further characterized in that the Schottky junction with the second part of the third region is formed by the said electrode layer, that the third and source regions are of N type silicon, and the source electrode is of aluminum.

10. A transistor as claimed in claim 1, further characterized in that the insulated gate is present on a part of the second region at a major surface of the body, and in that said source region and the first and second parts of said third region also adjoin said major surface.

11. A transistor as claimed in claim 1, further characterized in that the insulated gate is present on a part of the second region at a groove in a major surface of the body, and in that at least said source region adjoins said major surface.

* * * * *